(12) United States Patent
Tan

(10) Patent No.: US 8,252,695 B2
(45) Date of Patent: Aug. 28, 2012

(54) METHOD FOR MANUFACTURING A MICRO-ELECTROMECHANICAL STRUCTURE

(75) Inventor: Siew-Seong Tan, Hsinchu (TW)

(73) Assignee: Memsor Corporation, Hsinchu (TW)

( * ) Notice: Subject to any disclaimer, the term of this patent is extended or adjusted under 35 U.S.C. 154(b) by 148 days.

(21) Appl. No.: 12/955,223

(22) Filed: Nov. 29, 2010

(65) Prior Publication Data

US 2011/0250760 A1    Oct. 13, 2011

(30) Foreign Application Priority Data

Apr. 12, 2010    (TW) .............................. 99111316 A

(51) Int. Cl.
*H01L 21/302* (2006.01)
*H01L 21/461* (2006.01)
*H01L 21/00* (2006.01)

(52) U.S. Cl. ............... 438/712; 438/69; 438/51; 438/26; 257/E21.218

(58) Field of Classification Search ............... 438/712, 438/51, 69, 26; 257/E21.218
See application file for complete search history.

(56) References Cited

U.S. PATENT DOCUMENTS

| 7,413,846 B2 * | 8/2008 | Maloney et al. ............... 430/320 |
| 2009/0024113 A1 * | 1/2009 | Maloney et al. ........... 604/890.1 |

* cited by examiner

*Primary Examiner* — Nadine G Norton
*Assistant Examiner* — Mahmoud Dahimene
(74) *Attorney, Agent, or Firm* — CKC & Partners Co., Ltd.

(57) ABSTRACT

Disclosed herein is a method for manufacturing a micro-electromechanical structure. The method includes the following steps. A circuitry layer having a release feature is formed on an upper surface of a first substrate. A passive layer is formed on the circuitry layer without covering the release feature. The release feature is removed to expose the first substrate by a wet etching process. A portion of the exposed first substrate is anisotropically etched. A second substrate is disposed above the circuitry layer. A cavity is formed in the lower surface of the first substrate. The cavity is filled with a polymeric material. A portion of the first substrate under the microstructure is removed to release the micro-electromechanical structure.

10 Claims, 14 Drawing Sheets

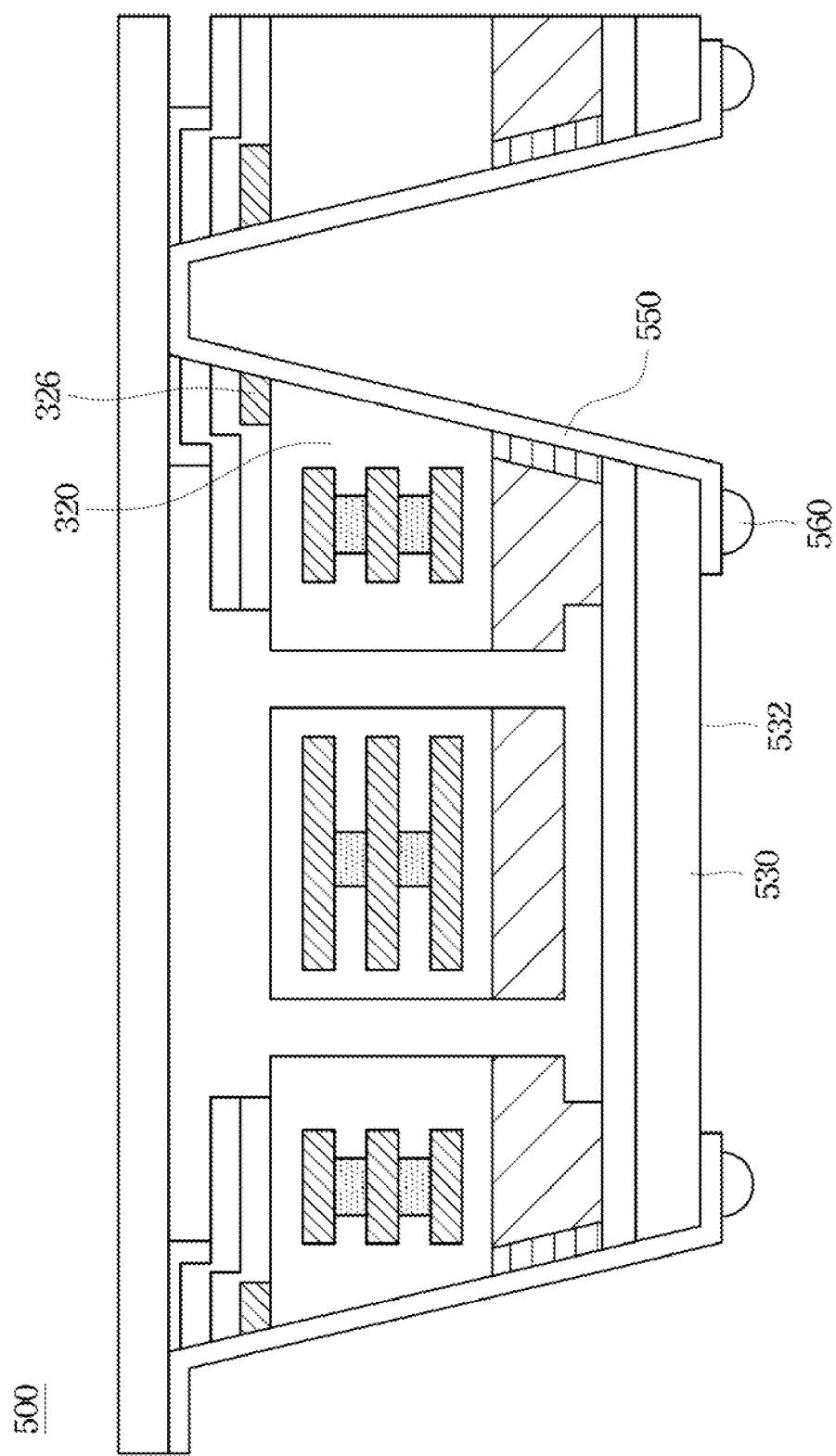

METHOD FOR MANUFACTURING A MICRO-ELECTROMECHANICAL STRUCTURE

This application claims priority to Taiwan Application Serial Number 099111316, filed Apr. 12, 2010, which is herein incorporated by reference.

BACKGROUND

1. Field of Invention

The present invention relates to a method for manufacturing a micro-electromechanical structure.

2. Description of Related Art

Along with the progress of the process technology in semiconductor, the micro-electromechanical system (MEMS) has gained more and more attention. In the prior art, an active device circuit and the micro-electromechanical structure of the MEMS are independently and separately fabricated in different processes. After individually completing the active device circuit and the micro-electromechanical structure, these two parts are combined on a same substrate, and thus forming the MEMS. The above-mentioned method also refers to "System In Package" (SIP).

In another method, the micro-electromechanical structure and the active device circuit are integrated together. In particular, the process of forming the micro-electromechanical structure is performed after the semiconductor devices such as MOS and BJT devices are completed in the active device circuit. And then, a metallization process may be performed on the active device circuit to accomplish the MEMS at a wafer level. Sequentially, the wafer is cut and divided into chips, and followed by packaging each of the chips.

In the process of forming the micro-electromechanical structure, a plasma etching process such as reactive ion etching (RIE) may usually be adopted to form the moveable parts or constitution of the MEMS. However, the etching profile in the RIE process is not so good, and the equipment required for RIE is expensive. In addition, prior to packaging the chips, particles or contamination in the environment is possibly fallen into the micro-electromechanical structure, and thus destroying the desired function of the micro-electromechanical structure. Therefore, there exists in the art a new method of fabricating the micro-electromechanical structure that would resolve the above-mentioned problems.

SUMMARY

A method for fabricating a micro-electromechanical structure is provided. The method comprises the following steps. A circuitry layer is formed on an upper surface of a first substrate, wherein the circuitry layer includes a microstructure, a release feature made of a metallic material and a pad positioned on a surface of the circuitry layer. The release feature surrounds a portion of a periphery of the microstructure and penetrates the circuitry layer a passive layer is formed on the circuitry layer without covering the release feature. The release feature is removed to expose the first substrate by a wet etching process. A portion of the exposed first substrate is etched anisotropically. A second substrate is disposed above the circuitry layer. A cavity is formed on a lower surface of the first substrate to expose the circuitry layer under the pad. The cavity is filled with a polymeric material. And then, a portion of the first substrate under the microstructure is removed so as to release the micro-electromechanical structure.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows:

FIG. 5A to FIG. 5C are cross-sectional views schematically illustrating process steps in FIG. 4.

DETAILED DESCRIPTION

Figure 1:
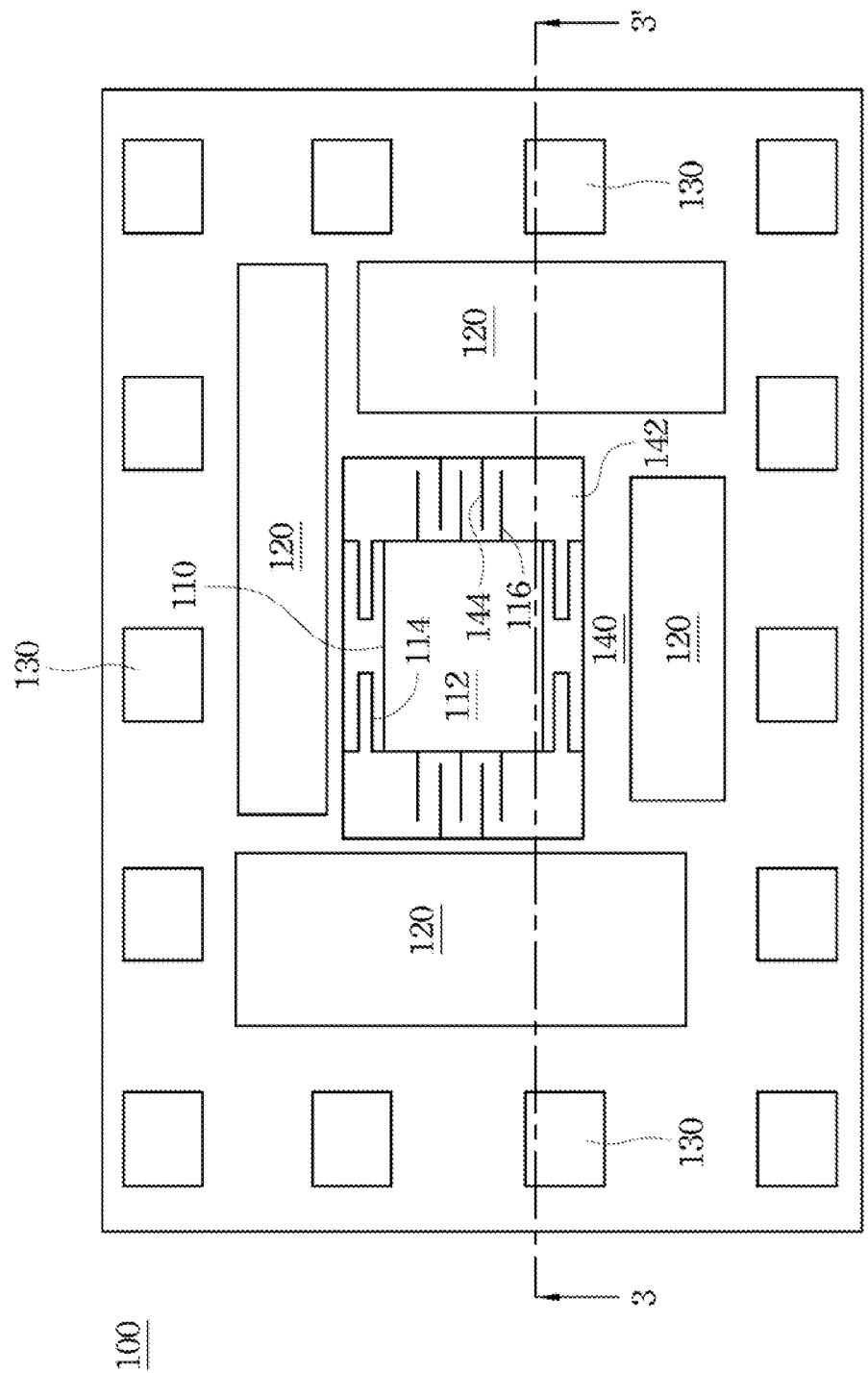
FIG. 1 is a top view of a micro-electromechanical structure according to one embodiment of the present disclosure.

Reference will now be made in detail to the present embodiments of the invention, examples of which are illustrated in the accompanying drawings. Wherever possible, the same reference numbers are used in the drawings and the description to refer to the same or like parts.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

FIG. 1 is a top view of a micro-electromechanical structure according to one embodiment of the present disclosure. The micro-electromechanical structure may be applied in a micro-electromechanical inertia sensor such as accelerometer or gyroscope. Although FIG. 1 depicts a micro-electromechanical accelerometer, the present disclosure is not limited thereto and the method disclosed herein may be applied in the field of other micro-electromechanical devices.

Referring to FIG. 1, the micro-electromechanical accelerometer 100 mainly includes a moveable microstructure 110, a semiconductor circuit 120 and a plurality of pads 130. The semiconductor circuit 120 substantially surrounds the moveable microstructure 110. Typically, the pads 130 are positioned on the periphery of the micro-electromechanical accelerometer 100.

The microstructure 110 is contended in the dent 142 of the substrate 140, and the microstructure 110 includes a center portion 112, at least one spring 114 and at least one protrusion 116. The spring 114 connects the center portion 112 with the substrate 140, and thus allowing the center portion 112 to be moveable. The protrusion 116 extends from the center portion 112, and allowing a capacitor to be formed between the protrusion 116 and another protrusion 144 which is extended from the substrate 140, as depicted in FIG. 1.

The semiconductor circuit 120 is electrically coupled to the protrusions 144, 116 for measuring the capacitance therebetween, Also, semiconductor circuit 120 may convert the measured capacitance into a voltage signal. The semiconductor circuit 120 may be electrically coupled to the pads 130, and may comprise a complimentary metal-oxide semiconductor (CMOS) device.

In operation, when the micro-electromechanical accelerometer 100 moves in a way of acceleration, the distance between the protrusions 144, 116 changes, and thereby the capacitance therebetween changes as well. The micro-electromechanical accelerometer 100 may estimate the acceleration by measuring the capacitance or the changes of the capacitance.

The micro-electromechanical accelerometer 100 discussed above is merely an exemplary example in order to provide a thoughtful understanding of the method disclosed hereinafter. The present disclosure is not limited to the method of manufacturing a micro-electromechanical accelerometer.

Figure 2:
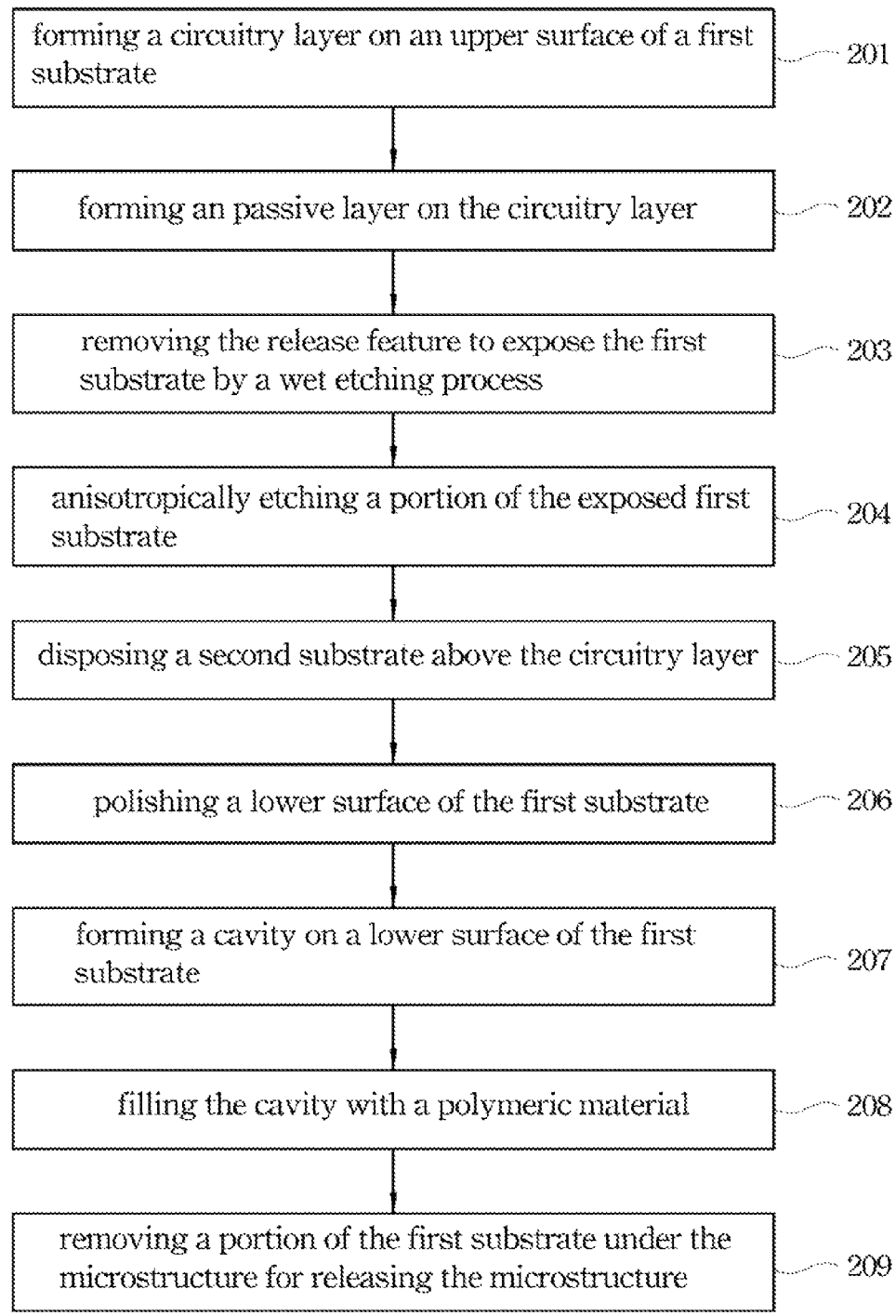
FIG. 2 is flow chart of a method for manufacturing a micro-electromechanical structure according to one embodiment of the present disclosure.

FIG. 2 is flow chart of a method for manufacturing a micro-electromechanical structure according to one embodiment of the present disclosure. FIG. 3A to FIG. 3H are cross-sectional views schematically illustrating process steps for manufacturing a micro-electromechanical structure according to one embodiment of the present disclosure. FIG. 3A to FIG. 3H are substantially taking along line 3-3' of FIG. 1. The method for manufacturing the micro-electromechanical structure is described in detail by the example of the micro-electromechanical structure depicted in FIG. 1. To facilitate understanding, identical reference numerals have been used, where possible, to designate identical elements that are common to the figures. It is contemplated that elements disclosed in one embodiment may be beneficially utilized on other embodiment without specific recitation.

Figure 3A:
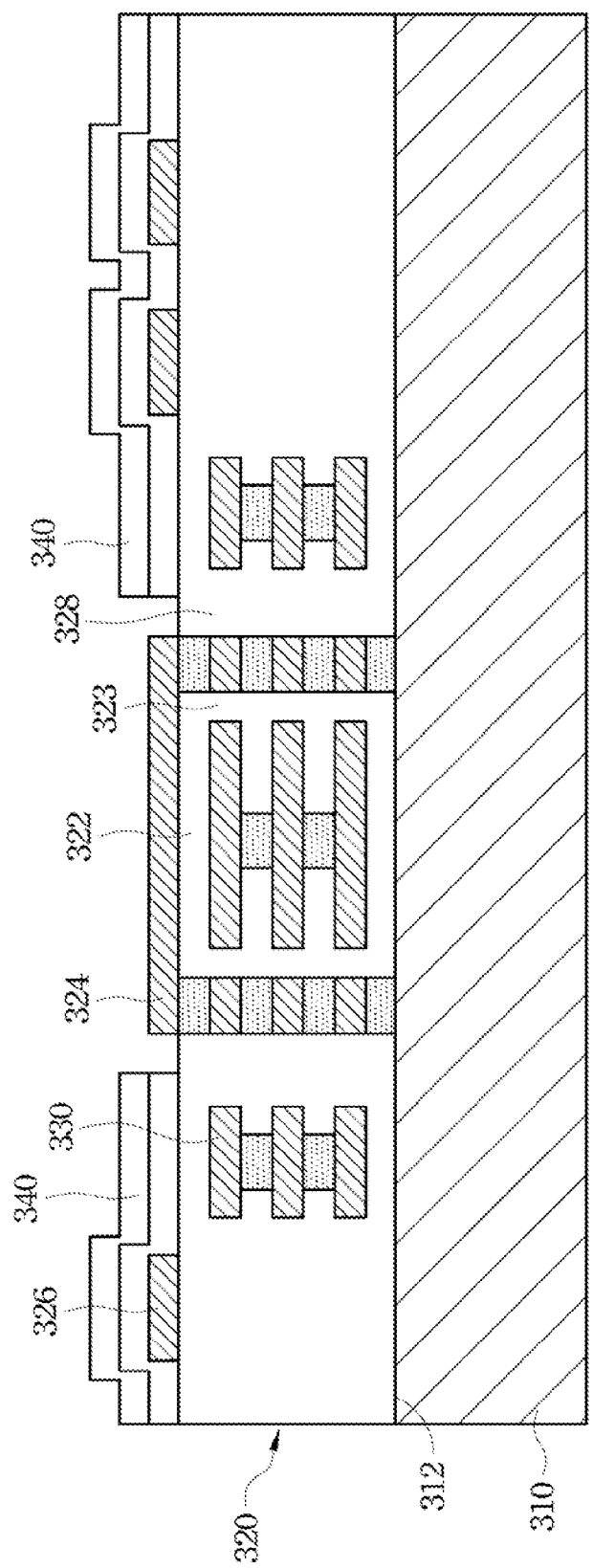
FIG. 3A to FIG. 3H are cross-sectional views schematically illustrating process steps for manufacturing a micro-electromechanical structure according to one embodiment of the present disclosure.

In step 210, a circuitry layer having a microstructure and a release feature is formed on an upper surface of a first substrate. As depicted in FIG. 3A, a circuitry layer 320 is formed on an upper surface 312 of the first substrate 310. The circuitry layer 320 comprises a microstructure 322, a release feature 324 and a dielectric layer 328. The release feature 324 is made of a metallic material and surrounds a portion of a periphery of the microstructure 322 and penetrates through the circuitry layer 320. In one example, the release feature 324 would be removed and form the dent 142 depicted in FIG. 1 in following processes. In another example, the first substrate 310 may be a silicon wafer.

In one example, the step of forming the circuitry layer 320 comprises forming a CMOS structure 330. Typically, in the standard process of the CMOS structure 330, there exists 4 steps of metallization process and 2 steps of polycide process (2P4M procedure), or 5 steps of metallization process and 1 steps of polycide process (1P5M procedure). Therefore, the release feature 324 may simultaneously be formed during the process of forming the CMOS structure 330 by a suitable mask design. The CMOS structure discussed above is an illustration only. Other structures such as BiCMOS or the like may be applied in the present disclosure as well, and therefore the present disclosure is not limited thereto. In addition, the present disclosure is not limited on the 1P5M procedure or the 2P4M procedure, and other fabricating procedures may also be employed. In particular, the dielectric material in the predetermined location of the release feature 324 may simultaneously be removed during the process of forming the via in the CMOS structure. And then, said predetermined location may simultaneously be filled with a metallic material during the process of forming the metallic layer of the CMOS structure. Accordingly, the release feature 324 may simultaneously be formed during the process of forming the CMOS structure 330. In another example, the metallic layer of the CMOS structure 330 is made of aluminum, and the via of the CMOS structure 330 is filled with tungsten. In still another example, the circuitry layer 320 comprises at least one pad 326 disposed on the surface thereof. The pad 326 is made of a metallic material, and electrically couple to the CMOS structure 330.

In one embodiment, the microstructure 322 may be formed in the same period of forming the CMOS structure 330. Referring to FIG. 1, the microstructure 322 may comprise a center portion 112, at least one spring 114 and at least one protrusion 116. The protrusion 144 extended from the substrate 144 may be formed in the same period of forming the CMOS structure 330. The interconnecting metallic lines in the micro-electromechanical structure may simultaneously be formed as well during the process of forming the CMOS structure 330. Therefore, the center portion 112, spring 114, protrusion 116, and protrusion 144 may respectively comprise a same metallic material as the CMOS structure 330 (for example, aluminum and/or tungsten). The metal layer in the protrusion 144 may be electrically coupled to the semiconductor circuit 120. The metal layer of the protrusion 116 may be electrically connected to the metal layer of the spring 114 through the metal layer in the center portion 112. Therefore, a capacitor may be formed between the protrusion 144 and the protrusion 116. In one example, as depicted in FIG. 3A, the microstructure 322 may comprise a dielectric material 323 which is made of the same material as that in the CMOS structure 330, for example, silicon oxide and/or silicon nitride. The dielectric material 323 is located on an outer surface of the microstructure 322, and may has a thickness of about 0.1 μm to about 3 μm, for example, 1 μm, 2 μm or 3 μm.

In step 202, a passive layer is formed on the circuitry layer. As depicted in FIG. 3A, a passive layer 340 is formed on the circuitry layer 320 without covering the release feature 324. In other words, the passive layer 340 is arranged to exposes the release feature 324. In one example, the passive layer may be a layer of silicon oxide or silicon nitride. Alternatively, the passive layer may have a multiple layered structure composed of silicon oxide and silicon nitride. The passive layer may be formed by chemical vapor deposition or other suitable technologies known in the art. In another example, the passive layer 340 may cover the pad 326, as illustrated in FIG. 3A. Although the formation of the passive layer is described in step 202, it may be combined into step 201.

Figure 3B:
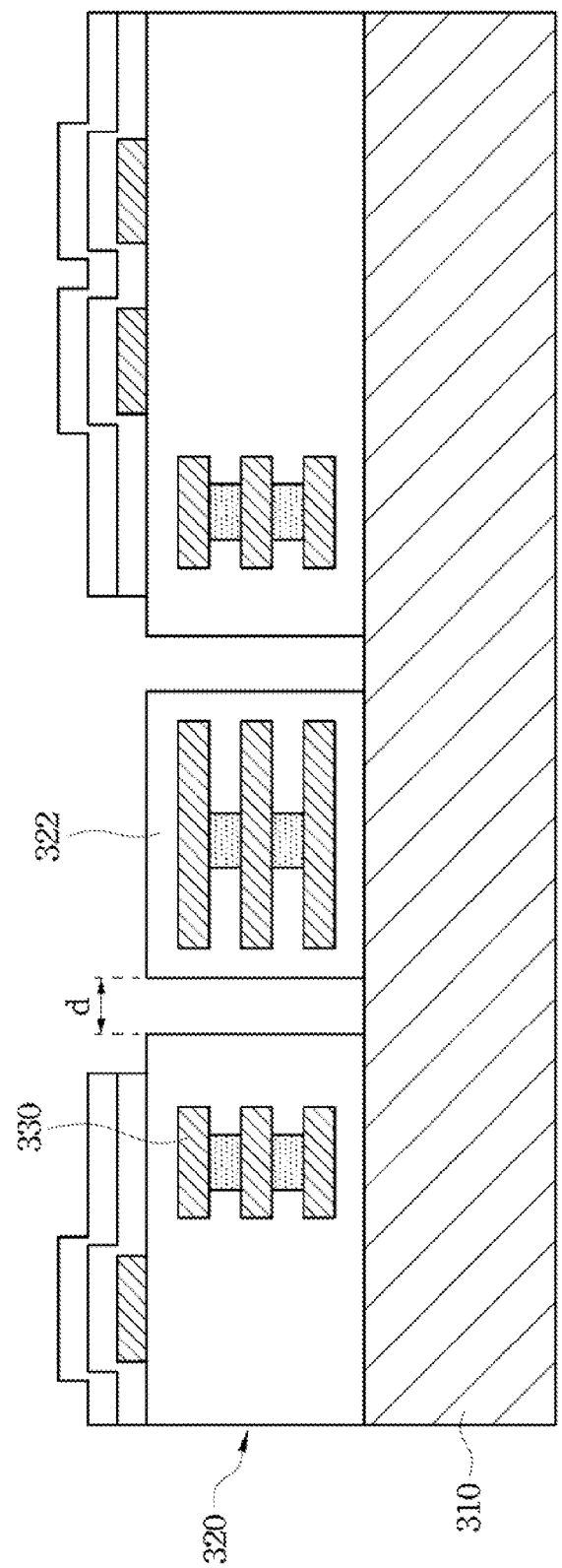

In step 203, removing the release feature to expose the first substrate by a wet etching process. Referring to FIG. 3B, the release feature 324 depicted in FIG. 3A is removed by a wet etching process so as to expose a portion of the first substrate 310. Therefore, a gap "d" is formed between the microstructure 322 and the circuitry layer 320. In one example, the width of the gap is about 1 μm to about 4 μm, for example, 2 μm or 3 μm. In step 203, the etchant used in the wet etching process exhibits a high etching selectivity of the metallic material to the dielectric material such as oxides or nitrides, for example, higher than 15:1 or 20:1 or 30:1 or more. Therefore, a better profile of the gap may be obtained when the wet etching process is performed. In one example, the release feature 324 may be composed of aluminum and tungsten, and the passive layer 340 may be made of silicon oxide. The etchant may comprise a mixture of sulfuric acid and hydrogen peroxide. In one specific example, the weight ratio of the sulfuric acid and the hydrogen peroxide is about 2:1, and a desired etching profile may be obtained. In one example, the dent 142 depicted in FIG. 1 may be formed after etching the release feature 324.

In the prior art, a reactive ion etching (RIE) process is employed to remove the dielectric material, such as silicon oxide and silicon nitride, of the circuitry layer so as to form the dent 142 in FIG. 1. However, the etching profile is not so good when using an RIE process. Moreover, the equipment required for an RIE process is expensive. If a typical isotropically wet etching process is directly employed to etch the dielectric material, it is difficult to form a good etching profile. According to one embodiment of the present disclosure, a metallic material is in advance filled in the predetermined region and thus forming the release feature 324. And then, the release feature 324 may be removed by a wet etching process. By applying an etchant having high etching selectivity, a better etching profile compared to the RIE process may be obtained. In addition, the release feature 324 may be formed in the same period of forming the circuitry layer 320, and therefore no additional process is required. Accordingly, the present disclosure is advantageous in both low cost and desirable etching profile.

Figure 3C:
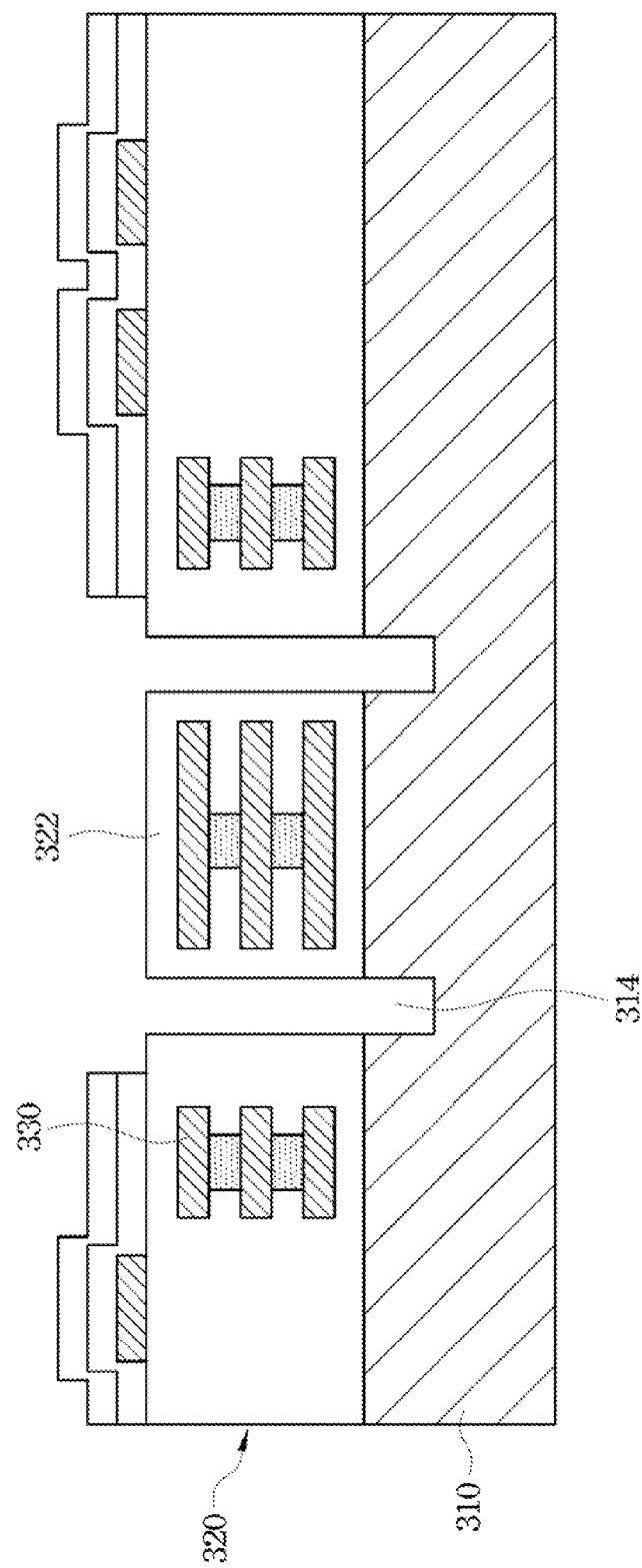

In step 204, a portion of the exposed first substrate is anisotropically etched. As depicted in FIG. 3C, a portion of the exposed first substrate 310 is removed by an anisotropically etching. In one example, the anisotropically etching comprises a deep ion reactive etching (DRIE). In another example, the anisotropically etching comprises forming a recess 314 in the first substrate 310, and the depth of the recess 314 is about 10 μm to about 60 μm, for example, 20 μm, 30 μm, 40 μm or 50 μm. In still another example, the recess 314 forms a portion of the dent 142 in FIG. 1. In the anisotropically etching process, the passive layer 340 such as silicon oxide and silicon nitride may protect, the underlying metal layer such as the pad 326 and the metal layer in the circuitry layer 320, and prevent the electrical property of the metal layer from being destroyed.

After removing the release feature 324 in step 203, an oxide layer is possibly formed on the exposed surface of the first substrate 310, i.e. located in the gap d. Therefore, prior to step 204, an RIE process may optionally be performed to remove the oxide layer on the surface of the first substrate 310 in the gap d. After moving the oxide layer, step 204 may be performed in sequence.

Figure 3D:
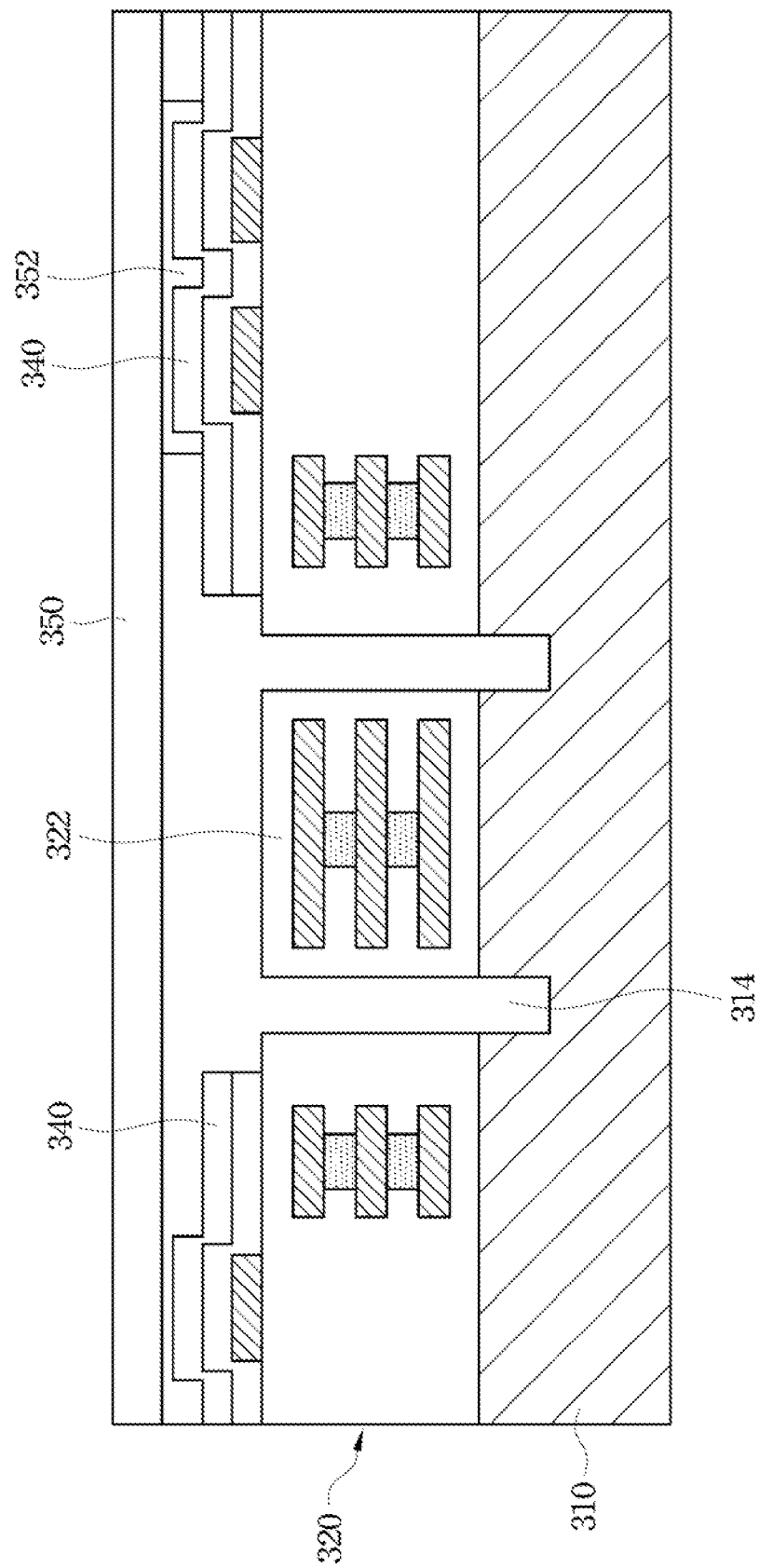

In step 205, a second substrate is disposed on the circuitry layer. As illustrated in FIG. 3D, a second substrate 350 is disposed on the circuitry layer 320 of the first substrate 310. The second substrate 350 may cover the microstructure 322 so as to prevent particles from bring fallen into the recess 314. In one embodiment, the second substrate 350 may be a glass substrate or a wafer substrate. The thickness of the second substrate may be about 50 μm to about 500 μm, for example, 100 μm, 200 μm, 300 μm and 400 μm. In another embodiment, an adhesive layer 352 may be arranged between the second substrate and the passive layer 340 to bind the first and second substrate together.

Figure 3E:
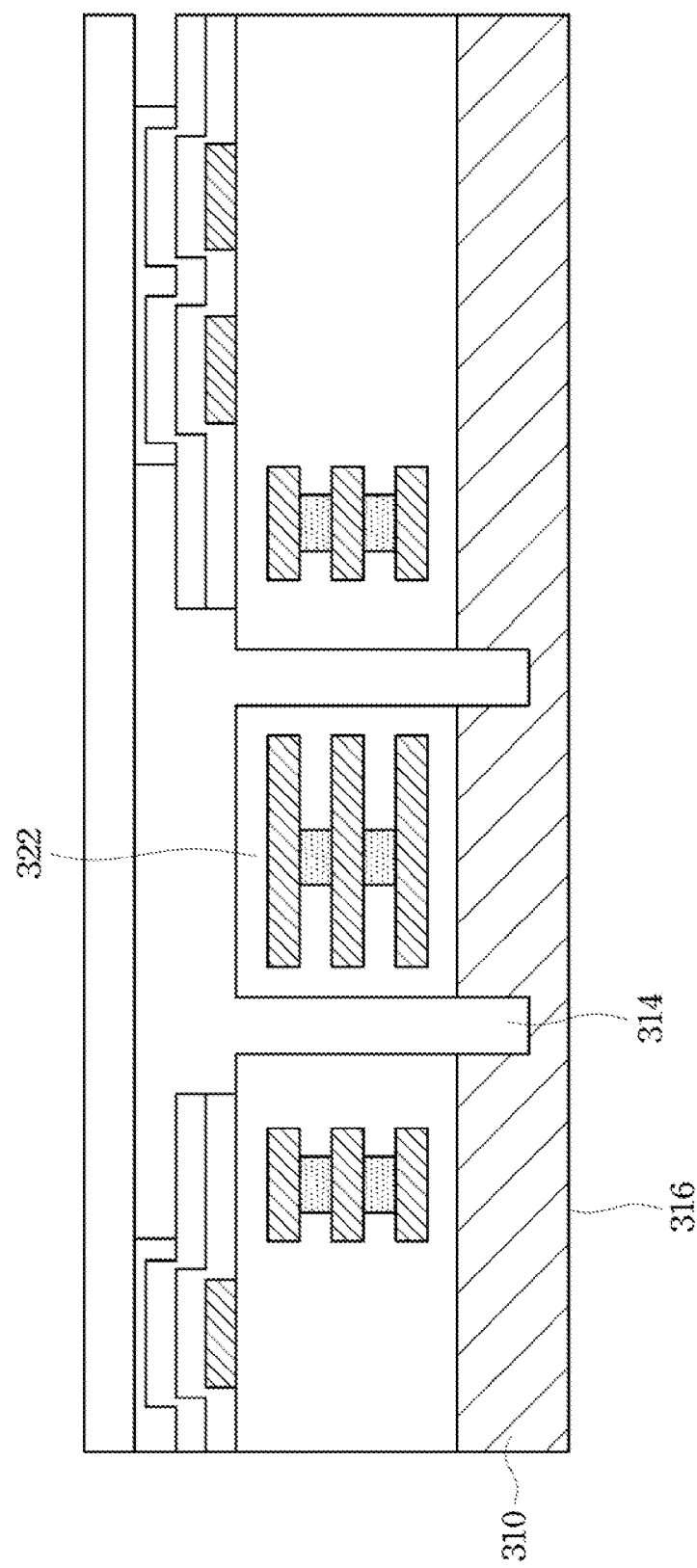

Optionally, step 206 may be performed after step 205. In step 206, a lower surface 316 of the first substrate 310 is polished in order to reduce the thickness of the first substrate 310, as depicted in FIG. 3E. For instance, the thickness of the first substrate 310 after polishing may remain about 50 μm to about 300 μm.

Figure 3F:
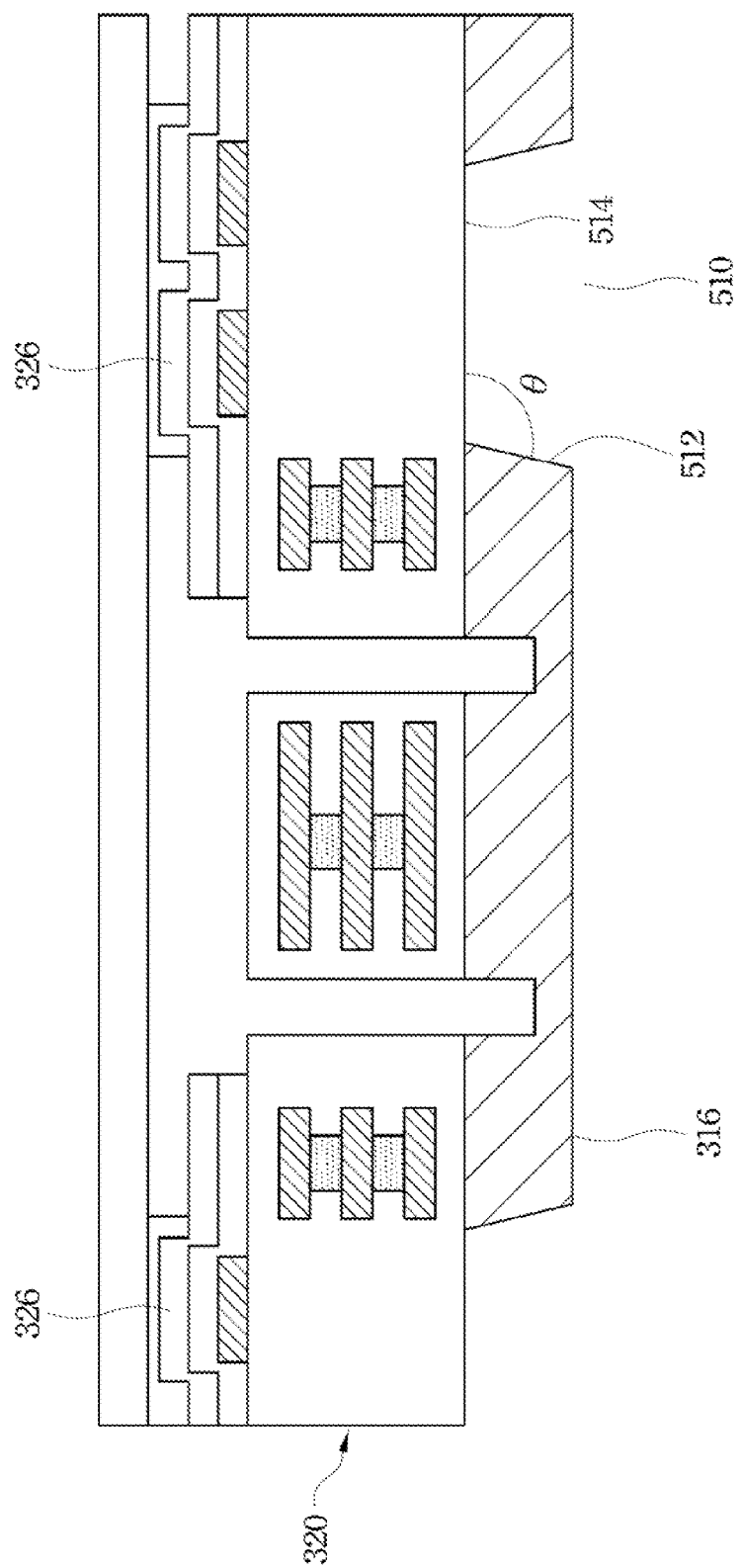

In step 207, a cavity 510 is formed on a lower surface of the first substrate 310 to expose the circuitry layer 320 under the pad 326, as depicted in FIG. 3F. The methods of forming the cavity 510 include, but are not limited to, dry etching, wet etching, mechanical drilling and laser drilling. In one embodiment, the cavity 510 has an inclined sidewall 512, and allowing an angle θ greater than 90 degrees to be formed between sidewall 512 and the lower surface 514 of the circuitry layer 320. The angle θ may be about 100, 110, 120, 140 or 150 degrees, for example.

Figure 3G:
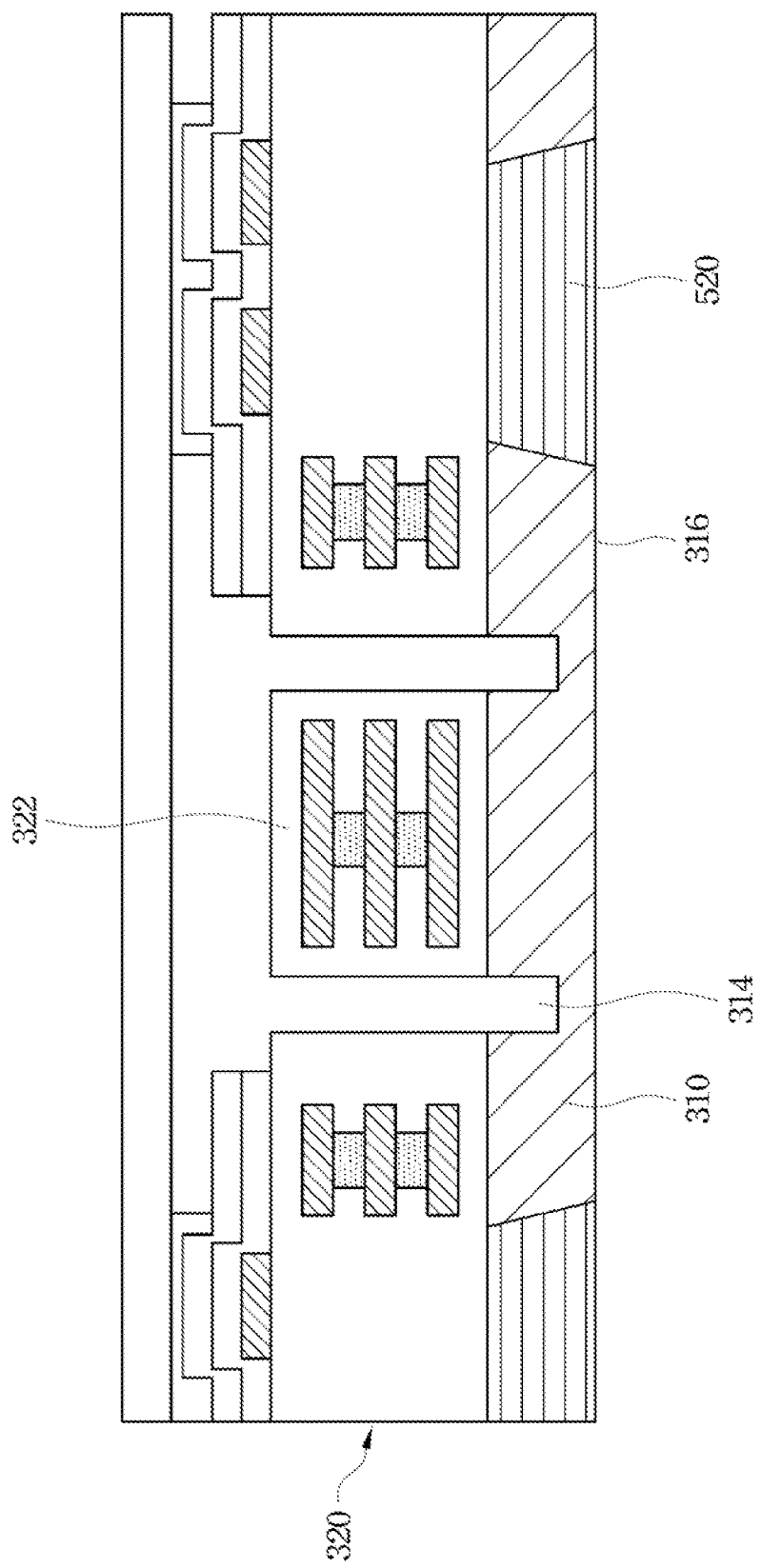

In step 208, a polymeric material 520 is filled in the cavity 510, as depicted in FIG. 3G. In one embodiment, the polymeric material 520 may be an epoxy resin. In another embodiment, the filled polymeric material 520 has a surface which is substantially at a same level as the lower surface 316 of the first substrate 310.

Figure 3H:
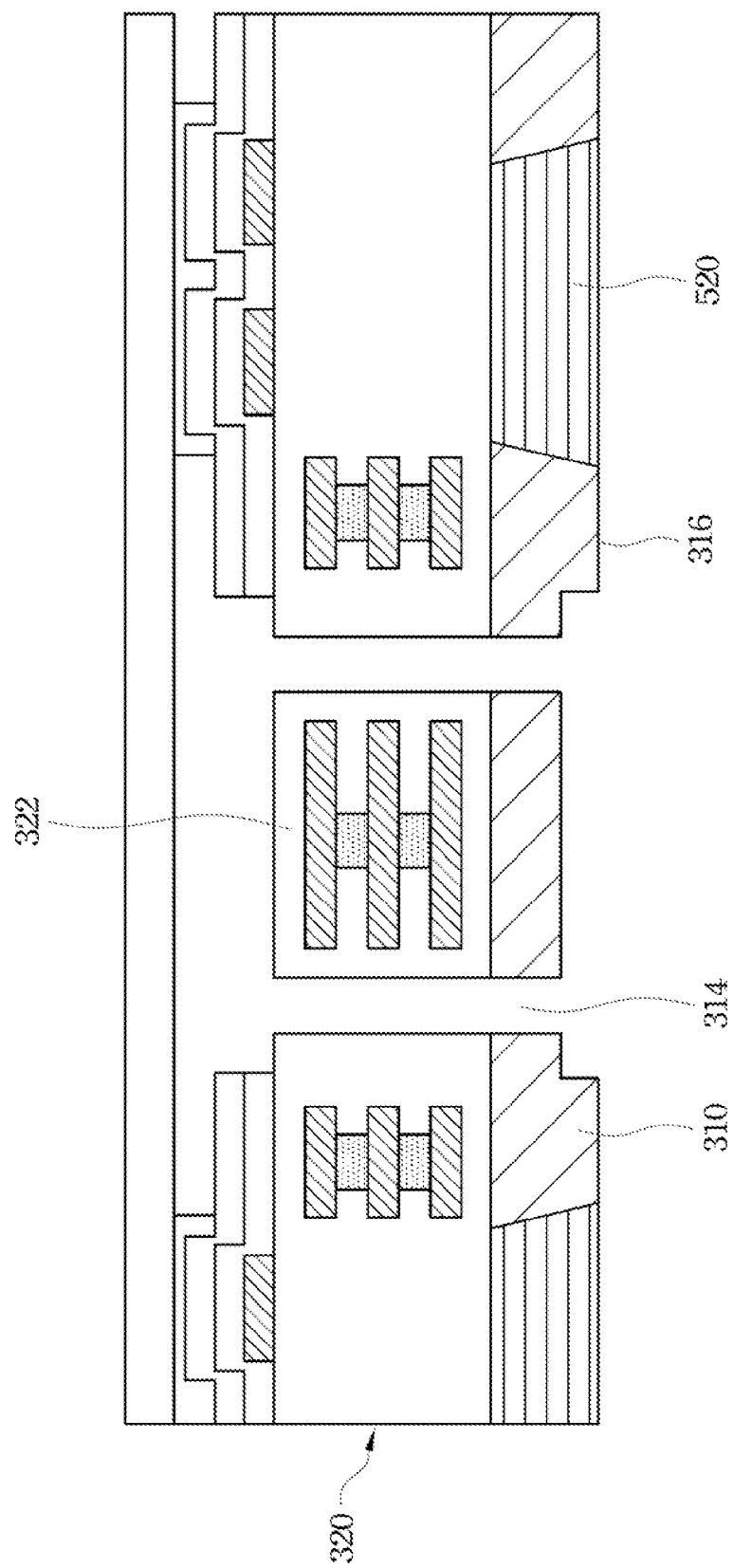

In step 209, a portion of the first substrate under the microstructure is removed to release the micro-electromechanical structure. In the present disclosure, the term "release the micro-electromechanical structure" refers to forming a relatively moveable part or constitution in the micro-electromechanical structure. In one embodiment, as depicted in FIG. 3H, a portion of the lower surface 316 of the first substrate 310 is removed by an anisotropically etching process so as to "release the micro-electromechanical structure". In another embodiment, a portion of the first substrate 310 under both the recess 314 and the microstructure 322 is removed by a DRIE process, and thereby the microstructure 322 becomes moveable relative to the first substrate 310, the dielectric mater 328 and the second substrate 350. In another embodiment, the microstructure 322 is connected to the circuitry layer 320 by the spring 114, as depicted in FIG. 1. Therefore, when a force acts on the microstructure 322, a small transposition of the microstructure 322 occurs.

Figure 4:
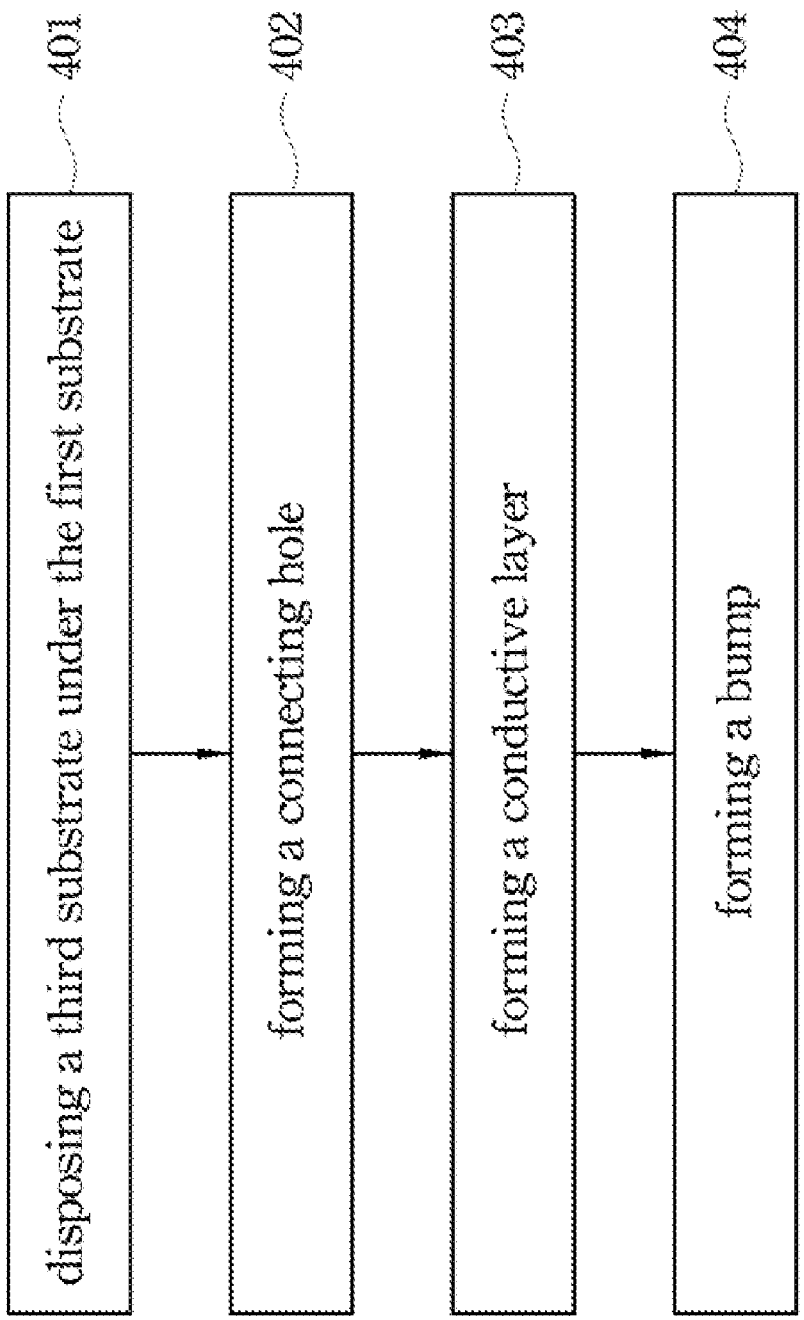
FIG. 4 is flow chart of being optionally performed after the method in FIG. 2.
Figure 5A:
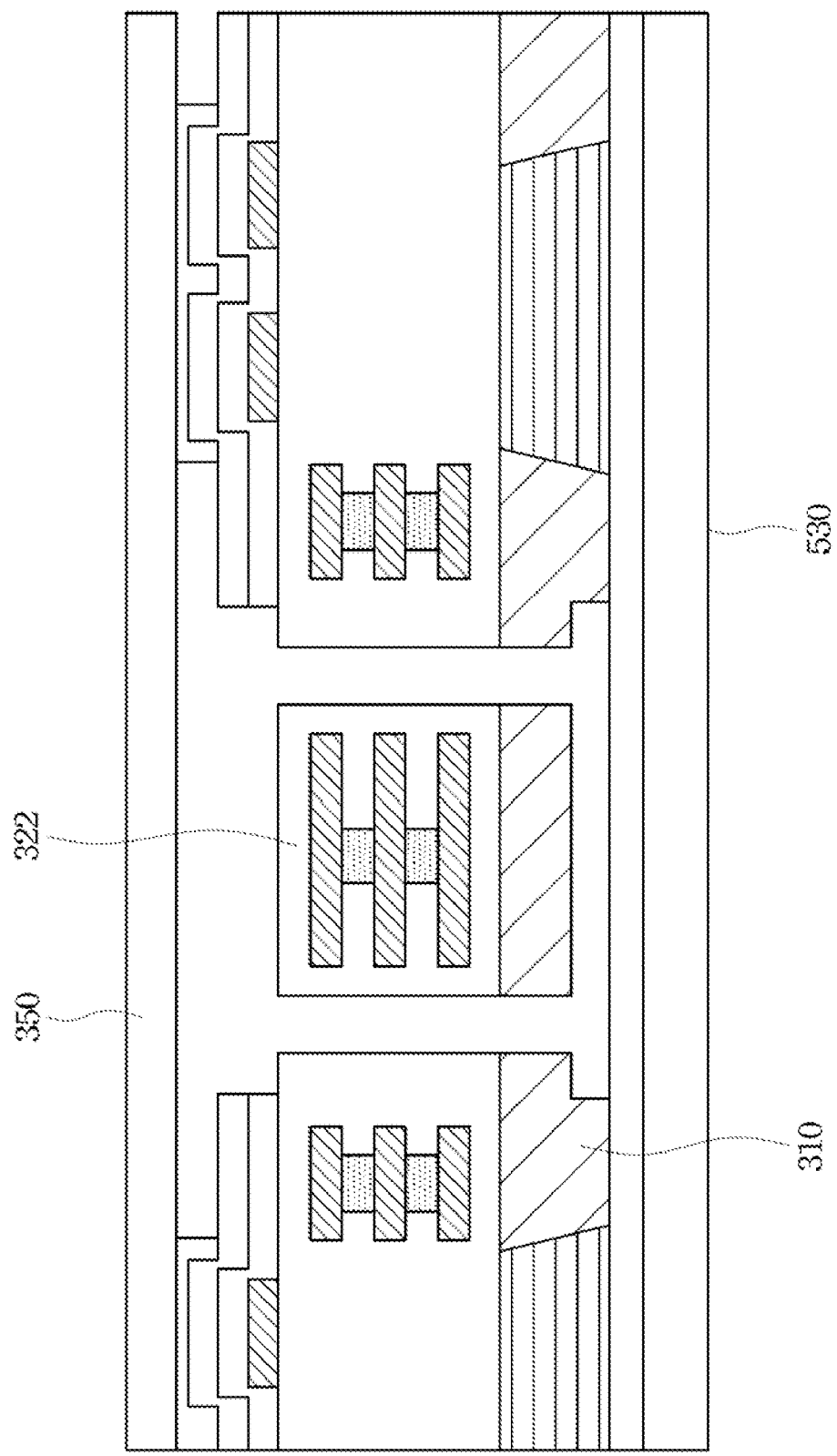
Figure 5B:
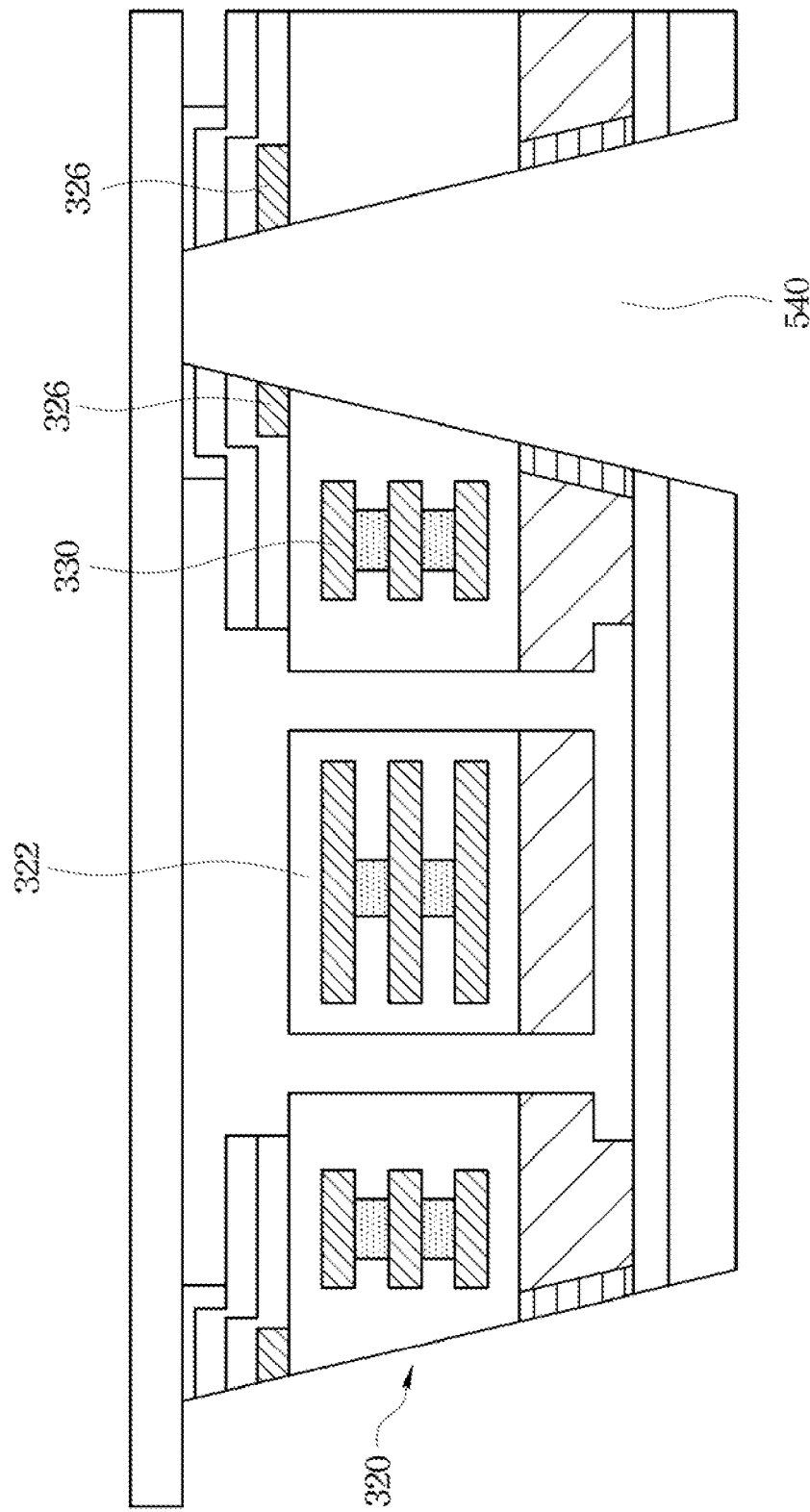

In other embodiments, as illustrated in FIG. 4, step 401 to step 404 may optionally be performed in sequence after step 209. FIG. 5A to FIG. 5C are cross-sectional views schematically illustrating process steps according to the flow chart of FIG. 4.

In step 401, a third substrate 530 is disposed under the first substrate 310, as illustrated in FIG. 5A. In one embodiment, the third substrate 530 may be made of a material that is the same as the second substrate 350 such as glass or silicon. A closed space may be formed between the second and third substrate 350, 530 and the microstructure 322 may be enclosed therein. Therefore, the second and third substrate 350, 530 may protect the microstructure 322 from being destroyed and also prevent particles from being fallen into the closed space. A desired function of the microstructure 322 may be ensured.

In step 402, a connecting hole 540 is formed from the side of the third substrate 530, as depicted in FIG. 5B. The connecting hole 540 penetrates the third substrate 530, the polymeric material 520 and the circuitry layer 320 so as to expose the pad 326. The connecting hole 540 may be formed by mechanical drilling or laser drilling, for example. In one embodiment, the pad 326 is electrically coupled to the CMOS structure 330. In another embodiment, the pad 326 is electrically coupled to the microstructure 322.

In step, 403, a conductive layer 550 is formed on the surface of the connecting hole 540, as illustrated in FIG. 5C. The conductive layer 550 may connect to the pad 326 so that an electrical signal may be transmitted into the circuitry layer 320 through the conductive layer 550. The conductive layer 550 may be formed by any method known in the art, and may be made of copper, aluminum, silver or tungsten. In one embodiment, the conductive layer 550 extends to the lower surface 532 of the third substrate 530.

In step 404, a bump 560 is formed on the conductive layer 550. Referring to FIG. 5C, in one example, the bump 560 is formed on the conductive layer 550 where is positioned on the third substrate 530. Therefore, electrical signals may be transmitted into or out from the micro-electromechanical structure 500 through the bump 560. Any method known in the art, for instance, screen-printing or solder ball planting may be employed to fabricate the bump 560. In other words, micro-electromechanical structure 500 may be connected to an external circuit (not shown) through the bump 560. When step 404 is completed, a micro-electromechanical structure package at a wafer level may be realized.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method for fabricating a micro-electromechanical structure, comprising:
   (a) forming a circuitry layer on an upper surface of a first substrate, wherein the circuitry layer includes a microstructure, a release feature made of a metallic material and a pad positioned on a surface of the circuitry layer, wherein the release feature surrounds a portion of a periphery of the microstructure and penetrates the circuitry layer;
   (b) forming a passive layer on the circuitry layer without covering the release feature;
   (c) removing the release feature to expose the first substrate by a wet etching process;
   (d) anisotropically etching a portion of the exposed first substrate
   (e) disposing a second substrate above the circuitry layer;
   (f) forming a cavity on a lower surface of the first substrate to expose the circuitry layer under the pad;
   (g) filling the cavity with a polymeric material; and
   (h) removing a portion of the first substrate under the microstructure for releasing the micro-electromechanical structure.

2. The method according to claim 1, wherein the step of forming the circuitry layer comprises forming a CMOS structure.

3. The method according to claim 2, wherein the release feature is formed during the period of forming the CMOS structure.

4. The method according to claim 1, wherein the step of forming the passive layer comprises forming an oxide layer.

5. The method according to claim 1, wherein the wet etching process comprises applying an etchant including sulfuric acid and hydrogen peroxide.

6. The method according to claim 1, wherein the step of anisotropically etching a portion of the first substrate comprises a step of deep reactive ion etching.

7. The method according to claim 6, wherein the step of anisotropically etching a portion of the first substrate comprises forming a recess in the first substrate with a depth of about 10 µm to about 60 µm.

8. The method according to claim 1, wherein the second substrate comprises a glass substrate or a silicon substrate having a thickness of about 50 µm to about 500 µm.

9. The method according to claim 1, further comprising polishing a lower surface of the first substrate for reducing a thickness of the first substrate after the step (e) but prior to the step (f).

10. The method according to claim 1, wherein the step of anisotropically etching a portion of the exposed first substrate comprises in sequence a step of reactive ion etching and a step of deep reactive ion etching.

* * * * *